United States Patent
Yoshida et al.

[11] Patent Number: 5,687,240
[45] Date of Patent: Nov. 11, 1997

[54] METHOD AND APPARATUS FOR PROCESSING DISCONTINUITIES IN DIGITAL SOUND SIGNALS CAUSED BY PITCH CONTROL

[75] Inventors: Akira Yoshida; Hiroyuki Saito, both of Gunma, Japan

[73] Assignee: Sanyo Electric Co., Ltd., Osaka, Japan

[21] Appl. No.: 346,483

[22] Filed: Nov. 29, 1994

[30] Foreign Application Priority Data

Nov. 30, 1993 [JP] Japan ................... 5-323328

[51] Int. Cl.$^6$ ................................................. H03G 3/00
[52] U.S. Cl. ................................. 381/61; 381/63; 381/94; 381/118; 84/619; 84/657; 84/685
[58] Field of Search ............................ 84/619, 657, 685, 84/622; 381/61, 63, 118, 94; 364/724.01, 723, 724.06, 724.17, 724.19

[56] References Cited

U.S. PATENT DOCUMENTS

| | | | |
|---|---|---|---|
| 5,131,042 | 7/1992 | Oda | 381/34 |
| 5,245,127 | 9/1993 | Yamauchi et al. | 84/630 |
| 5,248,845 | 9/1993 | Massie et al. | 84/622 |
| 5,367,118 | 11/1994 | Iwaooji | 381/61 |

OTHER PUBLICATIONS

Leland B. Jackson, Digital Filters and Signal Processing, second edition, pp. 45–46 1989.

*Primary Examiner*—Curtis Kuntz
*Assistant Examiner*—Duc Nguyen
*Attorney, Agent, or Firm*—Loeb & Loeb LLP

[57] ABSTRACT

Small discontinuities in digital sound data caused by a pitch control operation are processed by using a secondary FIR filter and smoothing the discontinuities. When lowering the key, the data value subject to the pitch down operation is moderately approximated to that of one sampling period before over a cycle of small discontinuity occurrence. when raising the key, the data value subject to the pitch up operation is moderately approximated to the current data value over a cycle of small discontinuity occurrence. By this method, the extent of the data discontinuity is greatly reduced. Large discontinuities for every segment are also processed by cross fading two converted data sequences which are produced from the input sound data and have different timings of large discontinuity occurrence, one data value being increased from its discontinuity point while the other data value is decreased from the same point in time. The weighting coefficients for the cross fade process vary in time along an upwardly convex polygonal line or a ¼ cycle of a sine curve, thereby reducing the extent of the large discontinuity and avoiding the offset of the overlapped two data values.

10 Claims, 11 Drawing Sheets

METHOD AND APPARATUS FOR PROCESSING DISCONTINUITIES IN DIGITAL SOUND SIGNALS CAUSED BY PITCH CONTROL

BACKGROUND OF THE INVENTION

1. Field of the Invention

This invention relates to an improved method and an apparatus for processing discontinuities in digital sound signals caused by pitch control of a musical accompaniment apparatus such as is used in a karaoke system or electronic musical instruments, like keyboards.

2. Description of the Related Art

Karaoke systems or electronic musical instruments generally have a pitch shift (key change) function, in an accompaniment section, to raise or lower the pitch in accordance with the preferred key of a singer or performer.

Typically, the pitch shift of an electronic musical instrument is carried out by converting a frequency Fi of input signal Si into a frequency Fo of output signal So. Prior to such a conversion, input signals are stored in the memory for every sampling period (1/Fs).

The principle of operation of the pitch shift in an electronic musical instrument is as follows. When lowering a key, certain read-out addresses are accessed twice, the cycle of such double read addresses being defined by the extent of pitch change. On the other hand, when raising a key, some read-out addresses are skipped, and again, the cycle of address skipping is defined by the extent of the pitch shift degree. However, at the time of this pitch shift operation, the tempo of the music is also changed according to the pitch change. Then, in order to maintain the correct tempo, a signal is thinned out by removing parts of the signal at predetermined intervals (segments) after the pitch down processing, while a signal is interpolated at a predetermined segment after the pitch up processing. However, this technique inherently involves two sources of sound quality degradation.

First, a data discontinuity of one sampling period (hereinafter, referred to as a small discontinuity) occurs every time that a double read-out or address skip is carried out for the pitch change.

Second, several ten milliseconds of data discontinuity (hereinafter, referred to as a large discontinuity) occurs every predetermined segment when a signal is thinned out or interpolated for the tempo adjustment.

Regarding the small discontinuities, two types of techniques have been conventionally employed for reducing the sound quality degradation at the small discontinuity points. That is, (i) smoothing of an abrupt shift at the discontinuity points by using a digital low pass filter, or (ii) Reading out two data items from an original input data with their phases shifted from each other, so that the small discontinuities of each of the data items offset with respect to each other, and taking an average of the two data values.

However, as well as the fact that the above described compensation techniques could not achieve a sufficient effect, they also imply other problems. That is, when using a low pass filter, since the cut off frequency of the low pass filter must be lowered for better smoothing, the level of the higher frequencies is degraded. While, when reading out two data items, memory capacity for program must be increased.

Figure 8:
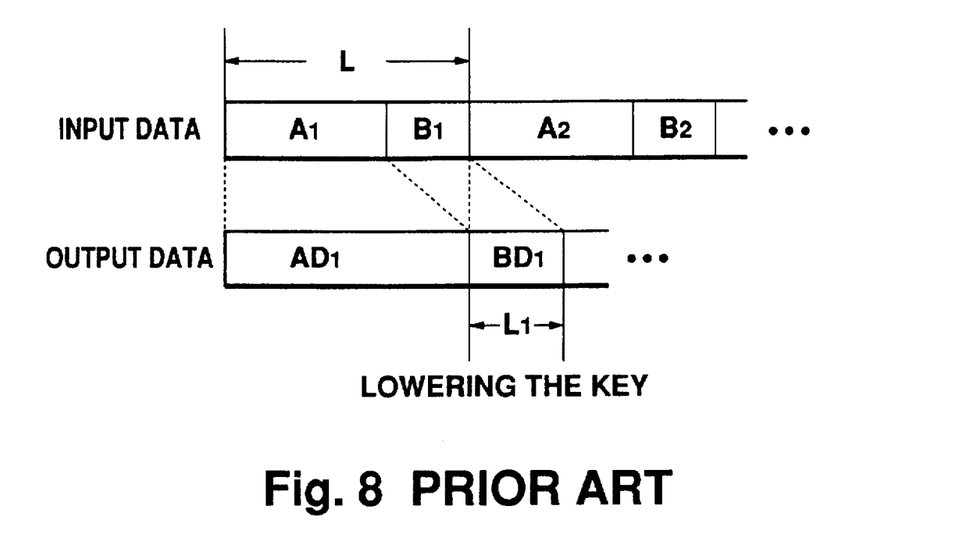
FIG. 8 shows the principle of conventional operation for pitch down processing.
Figure 9:
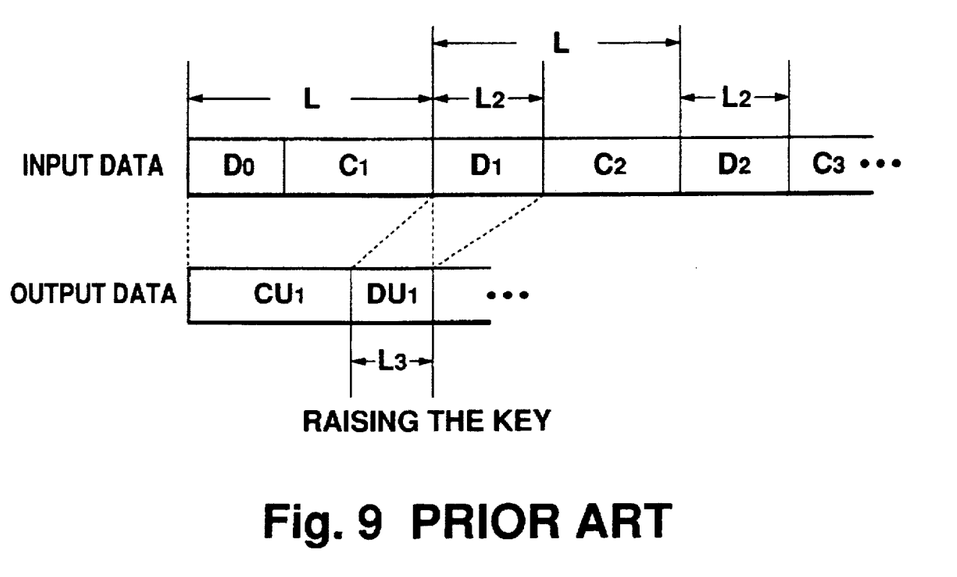
FIG. 9 shows the principle of conventional operation for pitch up processing.

Next, regarding the large discontinuity points, Garvey's "Cut & Splice Method" has been conventionally used. FIGS. 8 and 9 show the principle of operation of the cut & splice technique for the pitch shift, including data removal/interpolation at every segment.

FIG. 8 shows the principle of operation of pitch down processing, where data having a length of one unit time L is converted to data having a time length of L+L1, while FIG. 9 shows the principle of operation of pitch up processing, where data having a time length of L+L2 is converted to data of time length L. That is, data subject to pitch shift is divided into a predetermined time interval, for example, time interval L. Data is individually processed and converted for every time interval, and then connected together as shown in FIG. 10 to produce an overall sound signal which has been subjected to the pitch shift process.

It should be noted that the time length of the simply pitch shifted signal becomes different from that of the original input signal because of the double data read-out or data skip processing. The double data read-out is defined as, when reading out the digital sound data from the memory, the same data as one sampling period before being read out again in the current sampling period without updating the address. The data skipping is defined as, when reading out the digital sound data from the memory, a certain data being skipped by updating the address by 2 (normally, the address is updated by 1). In order to adjust the total time length of the processed data to the original time length, data interpolation or removal must be performed at every fixed time interval (unit time). More particularly, when the pitch is lowered, the input signal A1 is converted to the signal AD1 having a time length L because the double read out of the data is carried out for every certain cycle defined by the extent of the pitch change. Due to this pitch conversion, the converted signal BD1, which corresponds to the input signal B1 and now has a time length L1, must be removed for every unit time L after the pitch down processing (see FIG. 8). Whereas, when the pitch is raised, the input signal C1 having a time length L is converted to the signal CU1 having a time length shorter than L because the data skipping is carried out for every certain cycle defined by the extent of the pitch change. For this reason, the converted signal DU1, which corresponds to the input signal D1 and now has a time length L3, must be interpolated to make the converted signal have an original time length L. (see FIG. 9). After such processing for every unit time (segment) has been completed, segments are connected together for entire pitch conversion.

Figure 10:
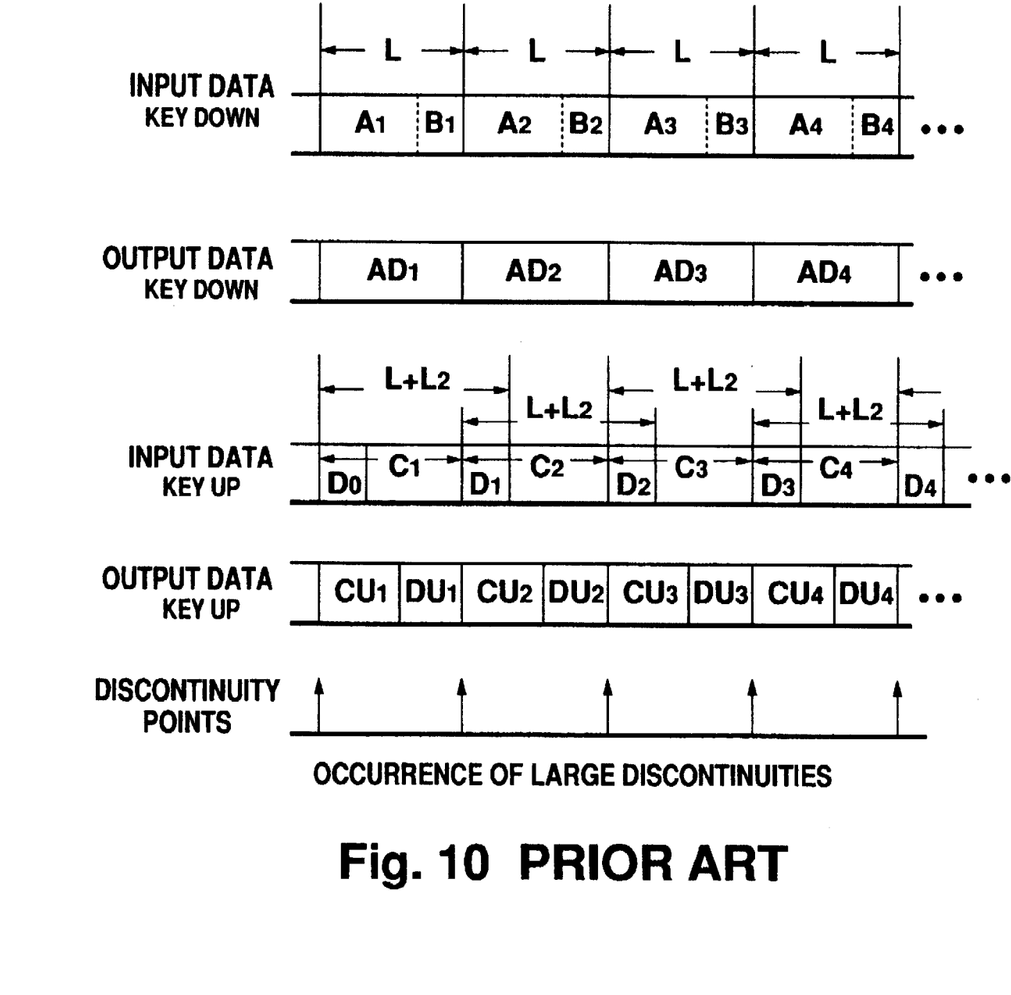
FIG. 10 shows large discontinuity occurrence points accompanying the pitch shift operation.
Figure 11:
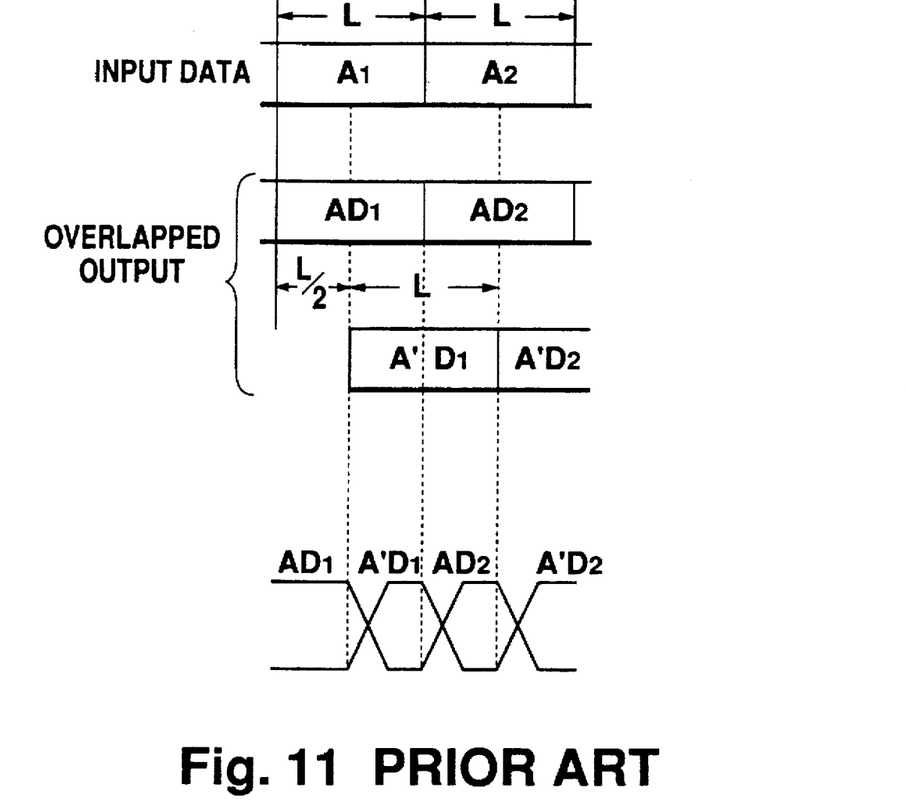
FIG. 11 shows prior art cross fade processing at a large discontinuity.

However, as a result of signal interpolation or removal, data discontinuities occurs at every connecting point, i.e. between the termination of a unit time L and the beginning of the next unit time L (as indicated by arrows in FIG. 10). In order to reduce the degradation of sound quality at the large discontinuity points, cross fade processing has been conventionally employed. FIG. 11 shows a conventional cross fading used in an example of a pitch down process.

First, two converted signals ADn and A'Dn are produced from one input data so that the timing of large discontinuity occurrence in the two signals are offset with respect to each other. This can be easily realized by delaying the starting point of the pitch shift processing for one signal by a time period of L/2 so as to shift the phase of the signal. Then, the two converted signals are overlapped, with the value of one signal being increased from its discontinuity point while decreasing the value of the other signal, which has not yet discontinuous at that stage, from the same point in time. In the figure, the converted signal A'D1 is gradually increased from its discontinuity point while the other converted signal AD1 is gradually decreased, and at the next discontinuity, the converted signal A'D1 is gradually decreased while the other converted signal AD2 is gradually increased from its discontinuity.

Thus, in a cross fading process, two converted data sequences are produced from one original data sequence. These data sequences are arranged so that the discontinuities of each data sequence are offset with respect to each other, more particularly, so that the phase of one of the two signal is shifted L/2 from the other signal. Then, the two signals are made composite, as the amplitude of one signal is faded in from its discontinuity point while the other signal is faded out from the same point in time. By repeating the fade in/fade out process, noise generated at the large discontinuity points is greatly reduced, which enables the pitch changed output sound to be more natural.

Figure 12:
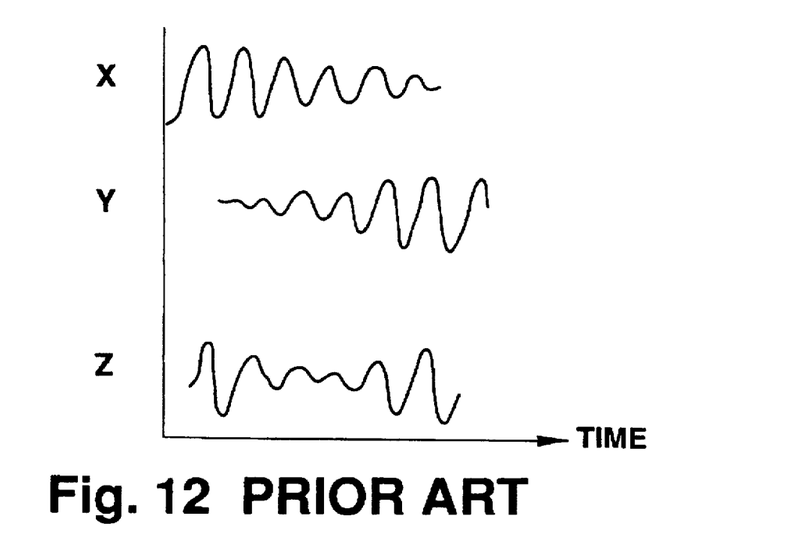
FIG. 12 shows examples of waveforms of output signals after the prior art cross fade processing.

However, since, in the conventional cross fade technique, weighting for each signal is linearly varied as shown in FIG. 11, the signals X and Y cancel each other when the phases of two signals are opposite to each other (i.e. out of phase by 180 degree). As a result, as is shown in FIG. 12, the resultant composite signal z, which is produced by overlapping the signals X and Y, is extinguished for a relatively long period. This means a zero output, and causes a degradation of the sound quality.

To sum up, the conventional methods inherently suffer from the following problems.

When processing small discontinuities by using a low pass filter, effective compensation is not achieved. Besides, the cut off frequency of the low pass filter must be lowered for providing a better compensation, which causes a degradation of higher frequencies. Meanwhile, when smoothing the small discontinuities by taking an average of two data values, the program capacity must be increased. Thus, it has been desired, for improvement of sound quality, to effectively smooth the small discontinuities without a complicated process or increased capacity.

Also, in a conventional technique for processing the large discontinuities, since two signals are overlapped with their weighting being linearly varied, a zero output occurs for a relatively long period, when the phases of the two signals overlapped by cross fading are completely opposite to each other. This results in a degradation of the sound quality. Thus, it is also desired to process the large discontinuities without a resultant signal of zero output.

SUMMARY OF THE INVENTION

In view of the above problems, it is an object of the invention to provide an improved method for effectively smoothing small discontinuities caused by the pitch shift operation of an electronic musical instrument with a simplified process, as well as to provide an improved method for processing large discontinuities while reducing the degradation of sound quality caused by overlapping of signals at large discontinuities. It is another object of the invention to provide an apparatus for changing keys without causing sound degradation by using the above methods.

In order to achieve these objects, the present invention provides an improved method for smoothing small discontinuities caused by a digital pitch shift operation. This method comprises the steps of (a) delaying an input signal, and (b) moderately approximating data which is being subjected to a pitch down operation to the delayed data, while moderately approximating data which is being subjected to a pitch up operation to current data.

This invention also provides a method for processing small discontinuities, comprising the steps of (a) multiplying a current input signal by a coefficient "a", (b) delaying the input signal, (c) multiplying the delayed signal by a coefficient "b", and (d) adding the products of the first and second multiplication for smoothing the small discontinuities during the pitch shift operation. The coefficients "a" and "b" are gradually varied while maintaining a predetermined relationship, so that a data value subject to pitch down processing is moderately approximated to the previous data value within a period where the discontinuity occurs, while a data value subject to pitch up processing is moderately approximated to the current data value within a period where the discontinuity occurs. Thus, by gradually varying the coefficients "a" and "b" in a predetermined relationship, small discontinuities are moderately smoothed by simple data processing.

In another aspect of the invention, a method for processing large discontinuities is provided for tempo adjustment. This method comprises the steps of (a) producing two converted data sequences from one input data sequence, each data sequence having a different timing of discontinuity occurrence, and (b) cross fading the two data values by overlapping them such that one data value is increased from its discontinuity point while the other data value is decreased. In said cross fading step, the weighting coefficients for said two data values are varied in time along an upwardly convex polygonal line, or along a polygonal line approximate to a ¼ cycle of a sine curve. Since the time varying weighting coefficients for the two data values track the upwardly convex polygonal line or polygonal line approximate to a ¼ cycle of a sine curve, the discontinuity in the data overlapping is smoothed, and the cancellation of the two data values caused by them being completely out of phase (i.e. 180 degrees out of phase) can be reduced, thereby suppressing the degradation of the sound quality.

In still another aspect of the invention, an apparatus is provided for changing the pitch of an electronic musical instrument while effectively processing discontinuity points. This apparatus comprises (a) means for sequentially storing said sound data, (b) means for inputting a pitch shift extent and for generating addresses in accordance with the pitch shift extent, certain addresses being generated twice for an appropriate cycle when the pitch shift extent represents a pitch down, and skipped addresses being generated for an appropriate cycle when the pitch shift extent represents a pitch up, (c) means for reading out two sound data sequences from one stored data sequence in response to the generated addresses, (d) first smoothing means for inputting and smoothing one of the two sound data values read out from the storage means, (e) second smoothing means for inputting and smoothing the other sound data values read out from the storage means, (f) means for calculating weighting coefficients for each of the smoothing process, based on the extent of the pitch shift degree, and applying the calculated coefficients to the first and second smoothing means, (g) means for cross-fading the two data smoothed by the first and second smoothing means, and (h) means for calculating weighting coefficients for cross fading, based on the extent of the pitch shift and applying the calculated coefficients to the cross fading means.

According to this apparatus, double addresses or skipped addresses are generated for every given cycle defined by the extent of the pitch change. Then, two converted data values are produced from the original data value stored in the storage means, in accordance with the generated addresses, both of which are to be subject to the smoothing process. At this time, weighting coefficients for the smoothing and weighting coefficients for the cross fading are separately calculated on the basis of the extent of the pitch change. Two data values are overlapped with the thus calculated weighting coefficients. Consequently, the abrupt discontinuities in the data sequences are effectively reduced, thereby suppressing the degradation of the sound quality.

In yet another aspect, an apparatus for processing small discontinuities caused by a digital pitch shift operation is provided. This apparatus comprises (a) means for multiplying a current input signal by a coefficient "a", (b) means for delaying the input signal, (c) means for multiplying the delayed signal by a coefficient "b", (d) means for adding the products of the first and second multiplications, and (e) means for controlling the smoothing coefficients "a" and "b" so that the data value which is being subjected to the pitch down processing is moderately approximated to the delayed data value within a period where the small discontinuity occurs and the data value which is being subjected to the pitch up processing is moderately approximated to the current data value within a period where the small discontinuity occurs, thereby greatly reducing the extent of the discontinuities.

In still another aspect of the invention, an apparatus for processing large discontinuities in the digital sound data is provided. This apparatus comprises (a) means for producing two converted data sequences from one original input data sequence, the timings of the large discontinuity occurrence for the data sequences being offset with respect to each other, (b) means for cross fading said two converted data sequences by overlapping them, one data value being increased from its discontinuity point with a weighting coefficient while the other is decreased with a weighting coefficient from the same point in time, and (c) means for controlling the cross fade weighting coefficients so that the weighting coefficients for the two data sequences vary in time along an upwardly convex polygonal line. The weighting coefficients may vary along a polygonal line approximate to a ¼ cycle of a sine curve.

Other objects, features and advantages of the invention will be apparent from the following detailed description taken in conjunction with the accompanying drawings.

DESCRIPTION OF THE PREFERRED EMBODIMENT

Preferred embodiments of the invention will now be described referring to the drawings.

First Embodiment

In the first embodiment of the invention, a method for processing a small discontinuity is provided. This method utilizes a secondary FIR filter configuration for the processing of the small discontinuities, although the conventional method has typically utilized calculation of an average of two data values. More particularly, the FIR filter of this embodiment carries out a processing where the current data is multiplied by a coefficient "a" and the previous data of one sampling period before is multiplied by a coefficient "b", and the two products are added.

Figure 1:
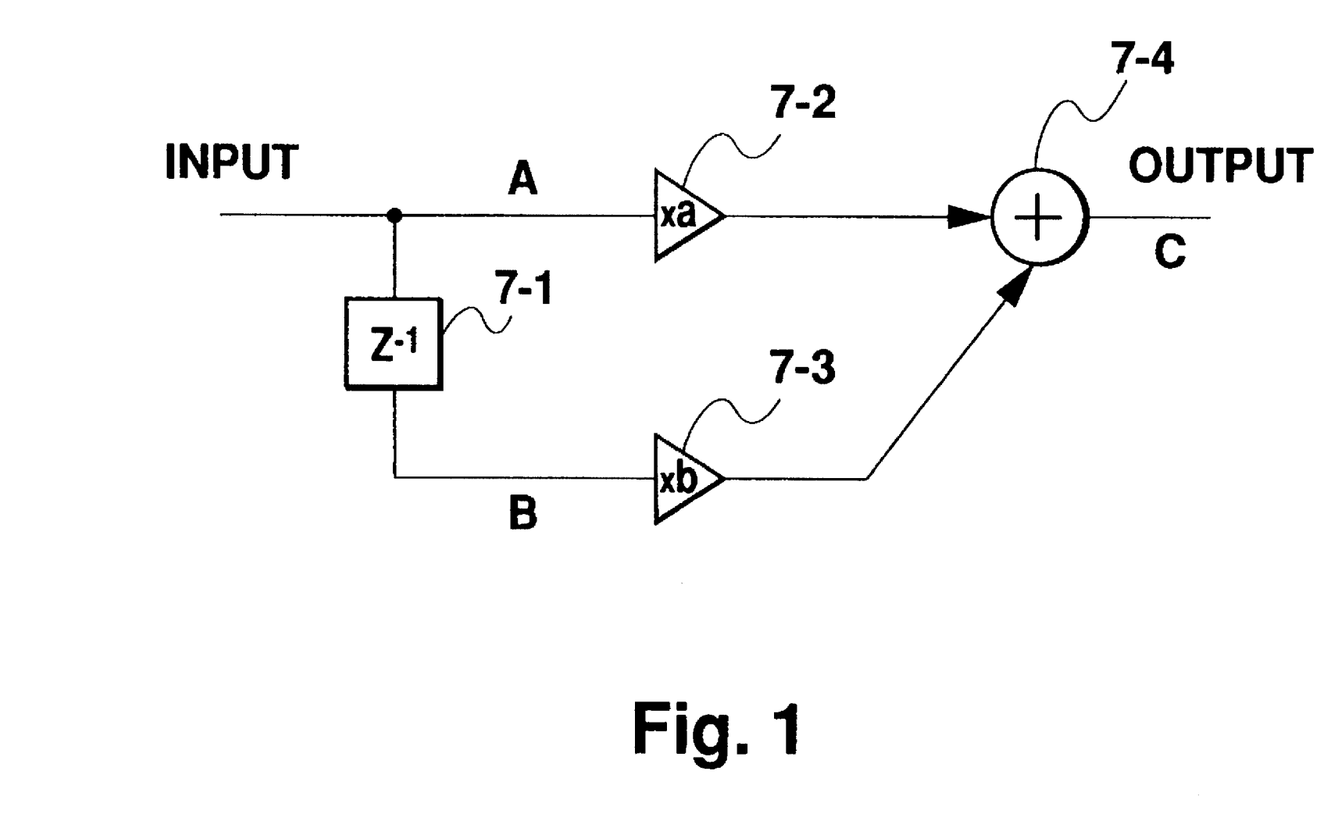
FIG. 1 shows a circuit used for processing the small discontinuities according to the present invention.

FIG. 1 shows a circuit for processing the small discontinuities (i.e. an FIR filter). The FIR filter includes a delay circuit 7-1 with a delay t0 of one sampling period (1/Fs), a multiplier 7-2 having a multiplication coefficient "a", a multiplier 7-3 having a multiplication coefficient "b", and an adder 7-4 for adding the output from the two multipliers. A current input signal I2 is input to the multiplier 7-2 via the line A, while a previous signal I1, which has passed through the delay 7-1 and is delayed by one sampling period (1/Fs), is input to the multiplier 7-3 via the line B. Input I2 and I1 are multiplied by a coefficients "a" and "b", respectively. The outputs from the multipliers 7-2 and 7-3 are added in the adder 7-4, and the resultant value is output on the line C.

First, the smoothing of the small discontinuity for pitch down operation will be described, referring to FIG. 2. In the pitch down operation, certain addresses are accessed twice without the updating of the address for a predetermined time period (or cycle) defined by the extent of the pitch change. In other words, data is read out from the same address as the one sampling period (1/Fs) before for every given time period. In this embodiment, a small discontinuity caused by the pitch down operation is effectively smoothed by moderately approximating a input data value to the data value of one sampling period before, within the period where the discontinuity occurs, by using smoothing coefficients "a", "b" and a pitch shift coefficient K. The coefficients "a" and "b" for each of the multipliers and a pitch shift coefficient K are represented in the following relationship.

$$a+b=1, a=a-K, b=b+K$$

Thus, the input data value is gradually approximated to the data value of one sampling period before by a value K for every sampling period to reduce the discontinuity amount.

Figure 13:
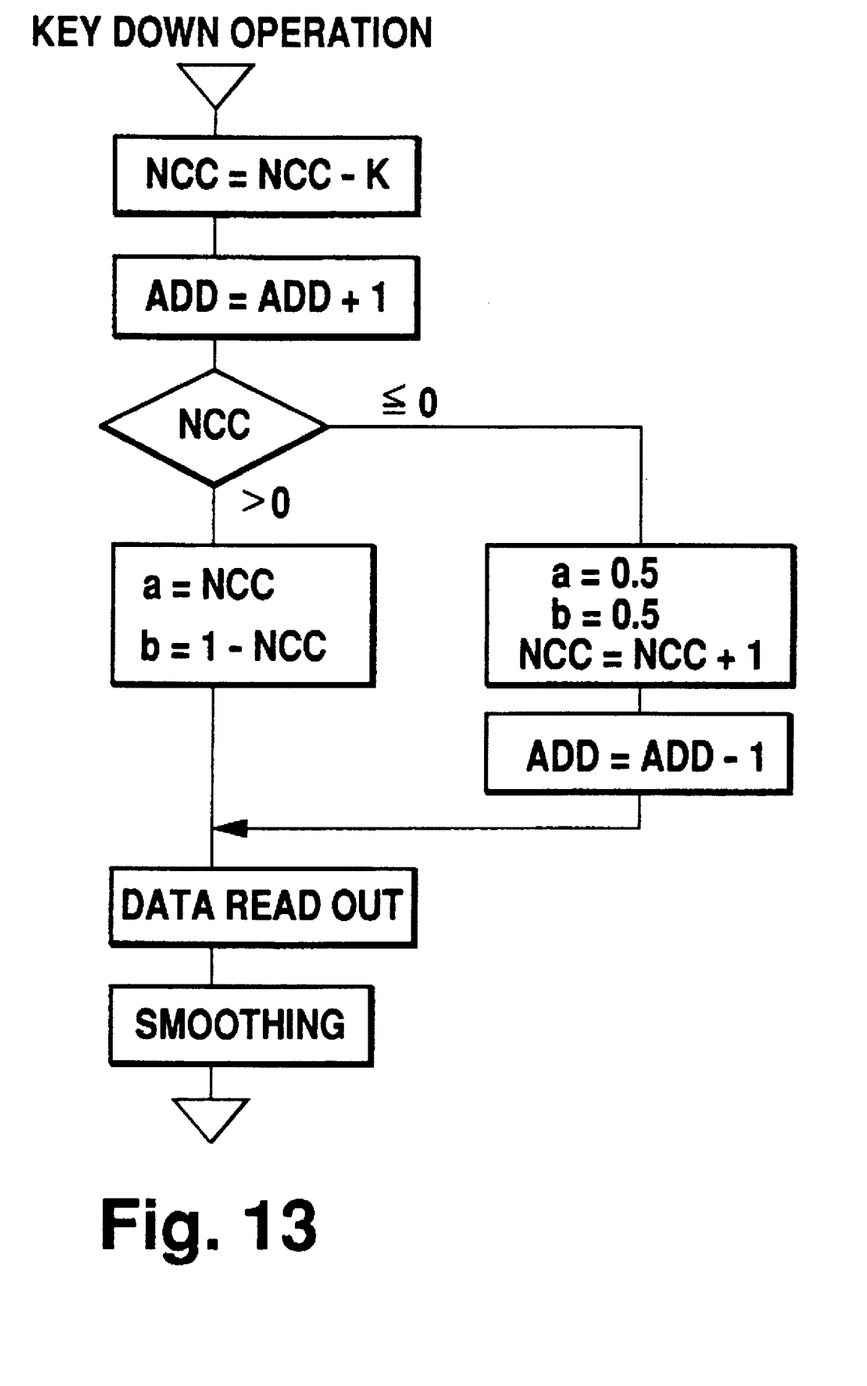
FIG. 13 is a flow chart showing processing of a discontinuity detection counter (NCC) for the pitch down operation to define the NCC value and the coefficients "a" and "b".

A discontinuity detecting counter (NCC) having an initial value of 1, which subtracts the pitch shift coefficient K for every sampling period, is used for this processing. As is shown in FIG. 13, in which ADD stands for read out address of the memory, when the NCC value is greater than zero (NCC>0), the value of the coefficient "a" corresponds to the NCC value and the coefficient "b" is "1−NCC". When the NCC value reaches zero or less, a value of 1 is added to the NCC and the value "a" is set to 0.5. At that time, a=b=0.5 and ADD is decremented, and therefore, reading out of the same data is achieved (i.e. a small discontinuity occurs). The table 1 shows an example of this processing when the pitch shift coefficient K is 0.2.

TABLE 1

| Fs  | T1  | T2  | T3  | T4  | T5   | T6  | T7  | T8  |
|-----|-----|-----|-----|-----|------|-----|-----|-----|
| NCC | 0.8 | 0.6 | 0.4 | 0.2 | 1(0) | 0.8 | 0.6 | 0.4 |
|     | ↓   | ↓   | ↓   | ↓   |      | ↓   | ↓   | ↓   |
| a   | 0.8 | 0.6 | 0.4 | 0.2 | 0.5  | 0.8 | 0.6 | 0.4 |
| b   | 0.2 | 0.4 | 0.6 | 0.8 | 0.5  | 0.2 | 0.4 | 0.6 |

Figure 2:
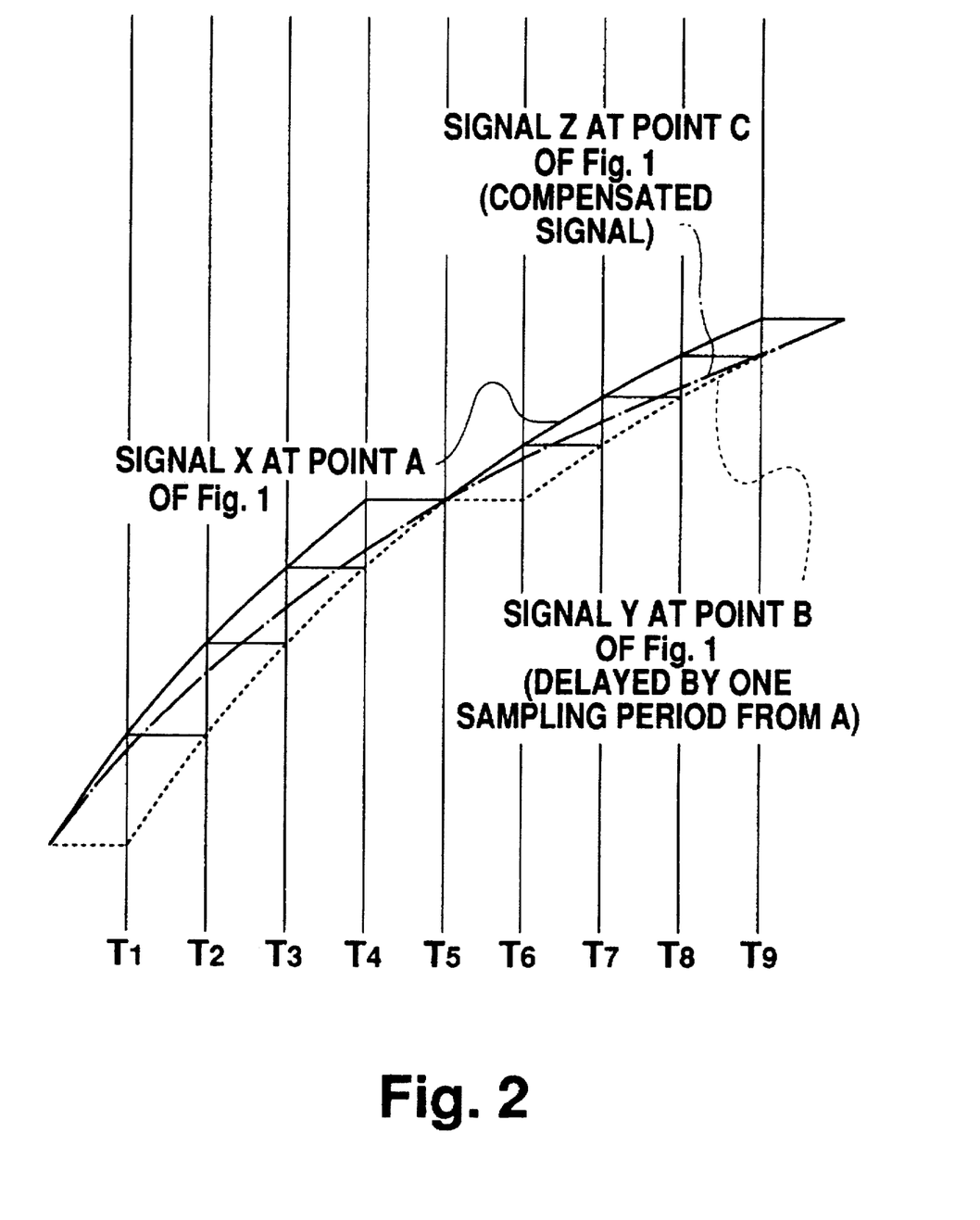
FIG. 2 is a chart for explaining signal processing for the small discontinuities caused by a pitch down operation, according to the present invention.

FIG. 2 shows an example of signal processing for the pitch down operation, where K is set to 0.2, X is a input signal, Y is a signal delayed by one sampling period, and Z is a smoothed composite signal.

During the sampling points T1–T4, the coefficient "a" is gradually increased while the coefficient "b" is decreased, and the output signal Z varies so that its value moderately approximates from the signal X to the signal Y. At T5, the NCC value reaches zero, and the same data as was read out at T4 is again read out. At this point, a=b=0.5, and the signals X, Y and Z coincide. Then, a value of 1 is added to the NCC (NCC=1) and a value K is immediately subtracted therefrom. Consequently, at T6, the coefficients "a" and "b" return to the same values as at T1, and the signal Z again varies so that its value approximates from the signal X to the signal Y. As is apparent from the comparison of the input signal X and the output signal Z, the discontinuity is effectively smoothed.

Next, the pitch up operation will be described referring to FIG. 3. When raising a key, data value subject to the pitch up processing is moderately approximated to the current data value, while maintaining the following relationship.

$$a+b=1, \ a=a+K, \ b=b-K$$

Figure 14:
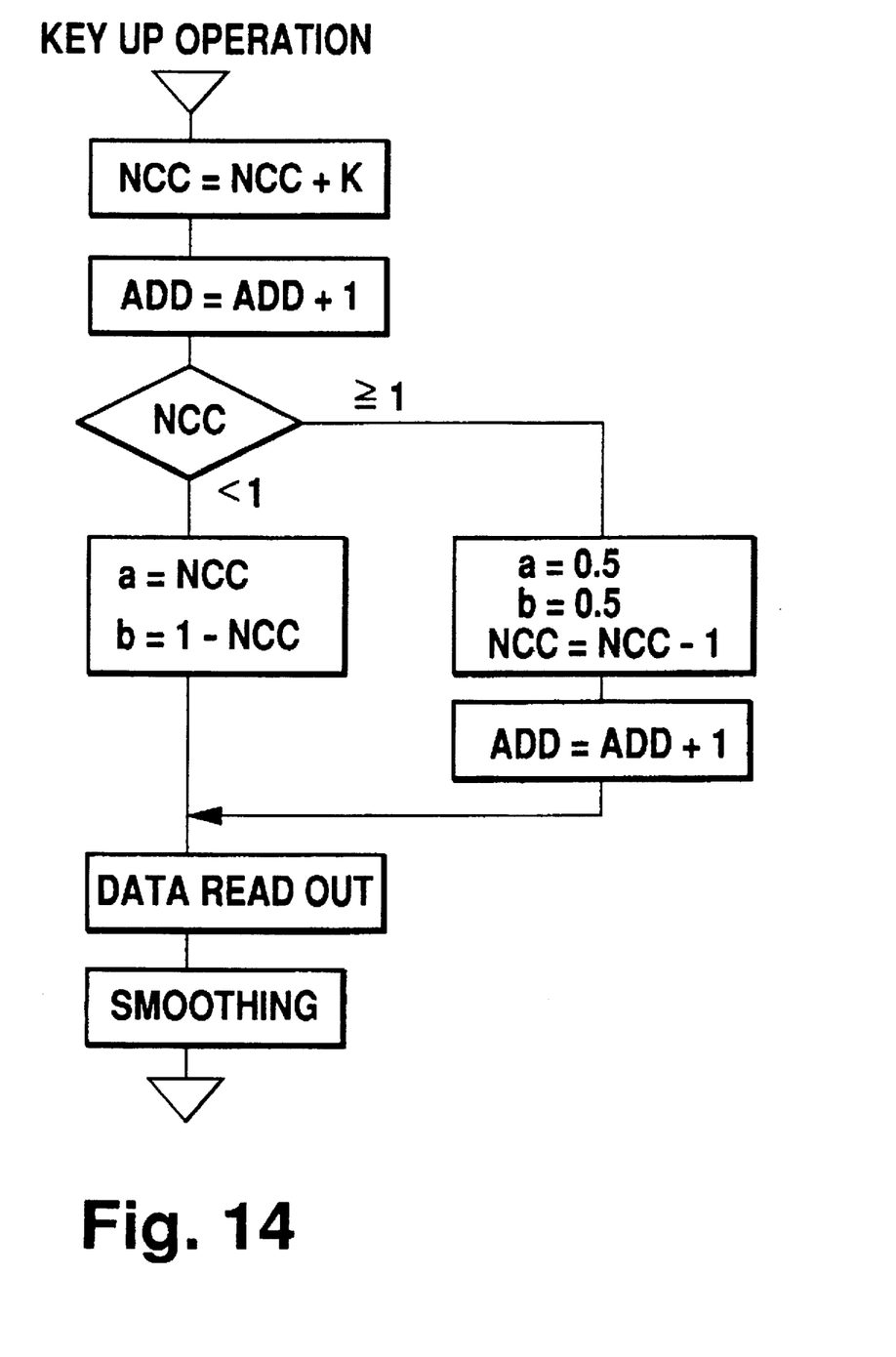
FIG. 14 is a flow chart showing processing of a discontinuity detection counter (NCC) for the pitch up operation to define the NCC value and the coefficients "a" and "b".

The principle of the pitch up processing is the same as the pitch down processing, and uses an FIR filter as shown in FIG. 1. This operation is shown in FIG. 14 and is opposite to the pitch down operation of FIG. 13. In this case, the initial value of the NCC is 0. The NCC value is increased by a value K for every sampling period, and when the NCC value reaches 1 or more, a value of 1 is subtracted from the NCC. At that time, ADD is incremented again, and therefore, data is skipped (that is, a small discontinuity occurs), and the coefficient "a" is set to 0.5. When the NCC value is smaller than 1 (NCC<1), the value of the coefficient "a" corresponds to the NCC value (a=NCC) while the coefficient "b" is "1−NCC". Table 2 shows an example of the pitch up processing when the pitch shift coefficient K is 0.2.

TABLE 2

| Fs  | T1  | T2  | T3  | T4  | T5   | T6  | T7  | T8  |
|-----|-----|-----|-----|-----|------|-----|-----|-----|
| NCC | 0.2 | 0.4 | 0.6 | 0.8 | 1(0) | 0.2 | 0.4 | 0.6 |
|     | ↓   | ↓   | ↓   | ↓   |      | ↓   | ↓   | ↓   |
| a   | 0.2 | 0.4 | 0.6 | 0.8 | 0.5  | 0.2 | 0.4 | 0.6 |
| b   | 0.8 | 0.6 | 0.4 | 0.2 | 0.5  | 0.8 | 0.6 | 0.4 |

Figure 3:
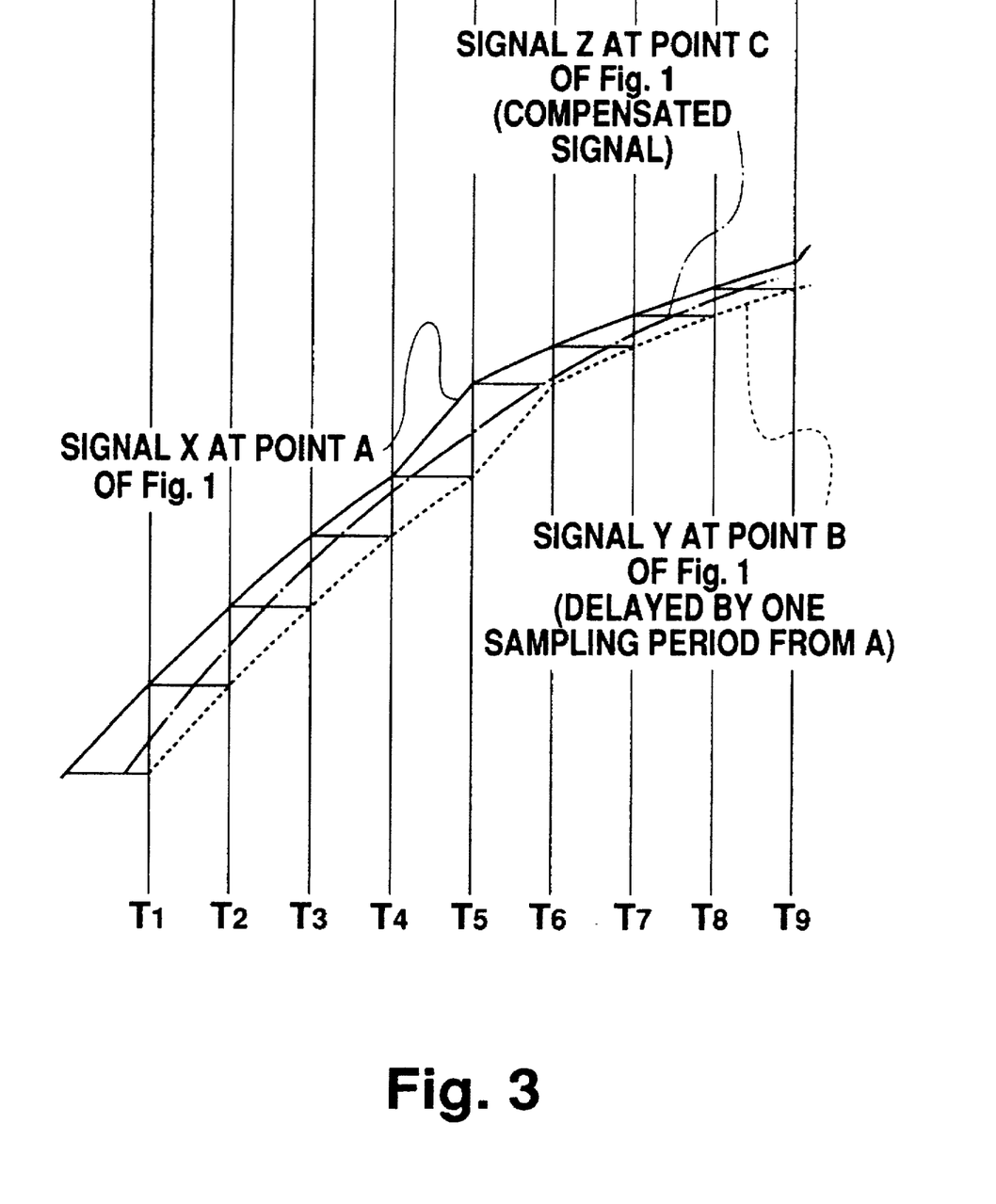
FIG. 3 is a chart for explaining signal processing for the small discontinuities caused by a pitch up operation, according to the present invention.

FIG. 3 shows an example of signal processing for the pitch up operation where the value K is set to 0.2. During the time periods T1–T4, the coefficient "a" is gradually increased, while the coefficient "b" is decreased, and therefore, the output signal Z varies so that its value approximates from the delayed signal Y to the current input signal X. At T5, the NCC takes a value 1, and the relation a=b=0.5 comes into effect. At this point, the current data is skipped, and the value of the output signal Z is a mean of the T4 data (i.e. one sampling period before) and the T6 data (i.e. one sampling period after). Then, a value of 1 is subtracted from the NCC value, and value K is immediately added. Therefore, at T6, the coefficients "a" and "b" return to the same values as at T1, and the output signal Z varies so that its value approximates from the signal Y to the signal X. Thus, as is apparent from the comparison of the output signal Z with the input signal X, the discontinuity is effectively smoothed.

Second Embodiment

In the second embodiment of the invention, an improved method for processing large discontinuities is provided. In this method, two data sequences are produced from one input data sequence, and are overlapped with their phase shifted. In the present invention, the weighting coefficient for cross fade processing does not vary linearly. Instead, it varies along an upwardly convex polygonal line (see lines A and B shown in FIG. 4). More particularly, the following processes are taken for cross fading.

(1) The cross fade processing is carried out by multiplying each of the two converted signals by a certain coefficient and adding the resultant products.

(2) Large discontinuities that occur at connecting points are detected.

Figure 4:
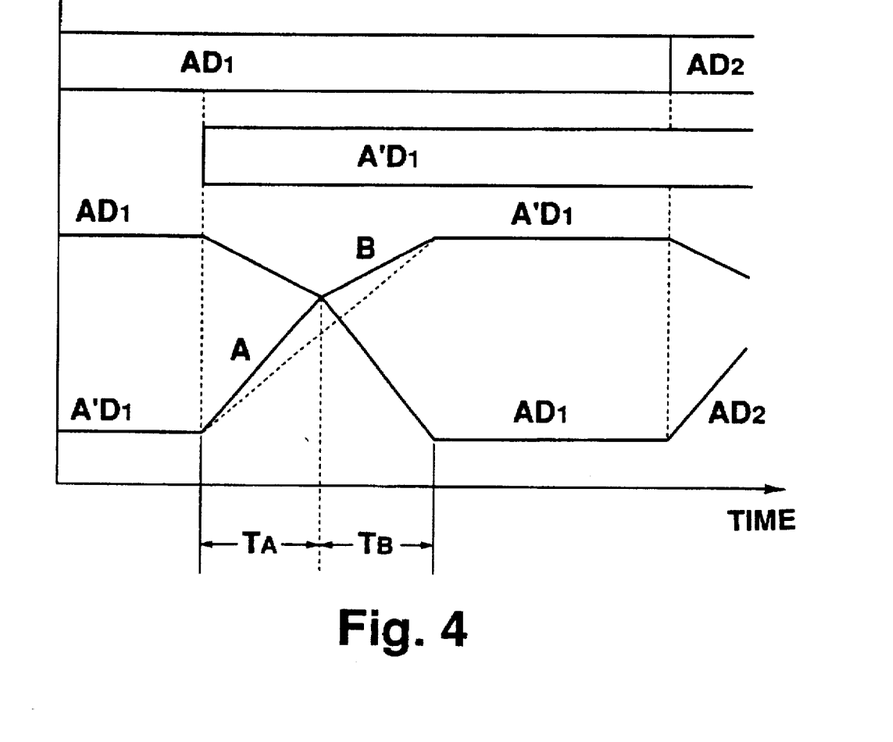
FIG. 4 shows the principle of the cross fade processing for the large discontinuities according to the present invention.

(3) From the discontinuity point of one converted signal, the weighting coefficient Ci for that discontinued signal is increased by a predetermined amount $\Delta Ci$ for every sampling period. The other weighting coefficient Cd for the other signal, which does not yet have a discontinuity, is decreased by a predetermined amount $\Delta Cd$ for every sampling period from the same point in time. The increasing amount $\Delta Ci$ is set greater than the decreasing amount $\Delta Cd$.

(4) As the above processing progresses, the level of the weighting coefficients Ci becomes greater than the level of Cd at a certain point. This point is detected. After this point, the values of $\Delta Ci$ and $\Delta Cd$ are switched, and Ci is increased by $\Delta Cd$ while Cd is decreased by $\Delta Ci$ for every sampling period. Thus, the cross fade progressing polygonal lines are achieved as shown in FIG. 4, which are symmetrical for the cross point. The above processing is represented by using Ci, Cd, $\Delta Ci$ and $\Delta Cd$ as follows.

At a section $T_A$ in FIG. 4, $$Ci=Ci+\Delta Ci, \text{ and } Cd=Cd-\Delta Cd$$

At a section $T_B$ in FIG. 4, $$Ci=Ci+\Delta Cd, \text{ and } Cd=Cd-\Delta Ci$$

(5) As the above processing progresses, the weighting coefficient Ci finally reaches 1 and the weighting coefficient Cd finally reaches 0. At this point, the weighting coefficients Ci and Cd are fixed to 1 and 0, respectively, and the next discontinuity occurrence is awaited.

(6) When the next discontinuity occurs, the process returns to the above step (2). This time, the discontinuity occurs in the other signal. The weighting coefficient Ci is always given to the discontinued signal, and the weighting coefficient Cd is always given to the not discontinued signal. The above steps (2)–(6) are repeated every time when the discontinuity occurs in either of the signals.

As a result of experimentation, it was found that the output sound quality after the pitch shift processing is greatly improved by appropriately setting the values of $\Delta Ci$ and $\Delta Cd$ in accordance with the extent of the pitch shift and by delicately adjusting the cross fade progressing lines. In the actual experimentation, the best result was obtained when the values of $\Delta Ci$ and $\Delta Cd$ were chosen so that these values become about 0.7 at the point that the weighting coefficients $\Delta Ci$ and $\Delta Cd$ become equal (after this point, the values of Ci and Cd are switched). This is explained in reference to FIG. 5.

Figure 5A:
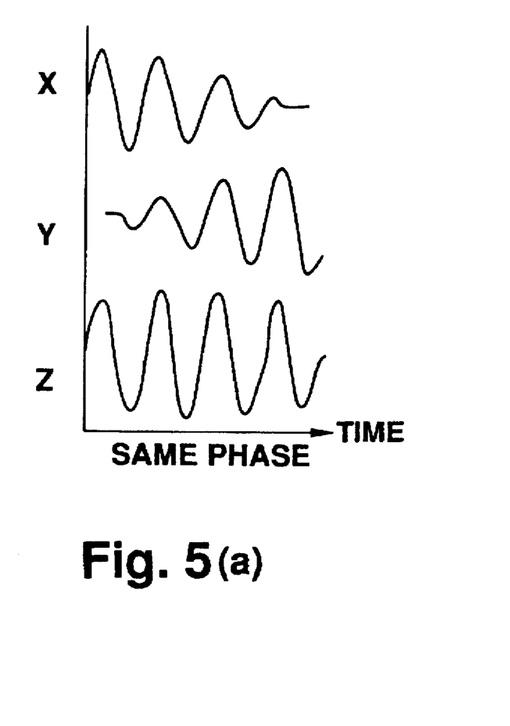
FIG. 5 shows examples of the waveform of output signals after the cross fade processing of the present invention.
Figure 5B:
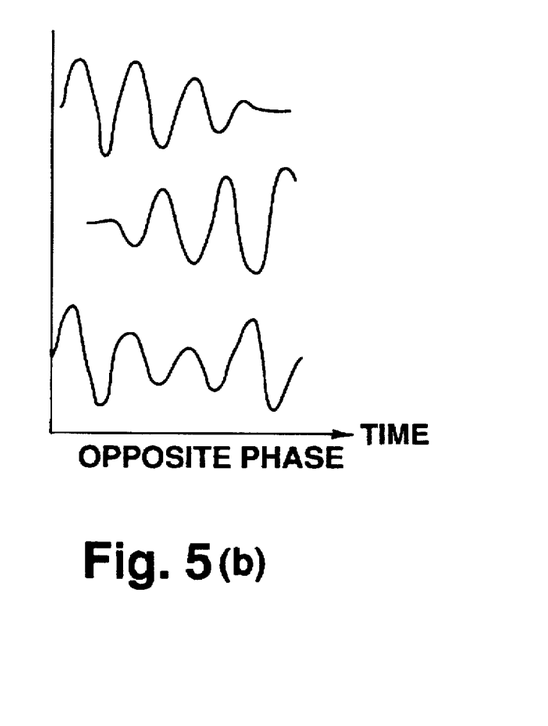

Since the signal Z is produced by cross fading the signals X and Y with the respective weighting coefficients being varied along the upwardly convex polygonal lines, a long period of offset of the signals is avoided even when the phases of the two signals are opposite. Although, in the case that the two signals have the same phase, the amplitude of the signal Z is increased beyond the original amplitude because of the weighting, the total sound quality is greatly improved by avoiding long periods of zero output.

In this embodiment, cross fading is progressed along the upwardly convex polygonal lines for the purpose of simplifying the memory capacity for the program of the digital signal processor. However, greater improvement of the sound quality of the post pitch changed signals is achieved by advancing the cross fading along a polygonal line approximate to a ¼ cycle of a sine curve.

Third Embodiment

Figure 7:
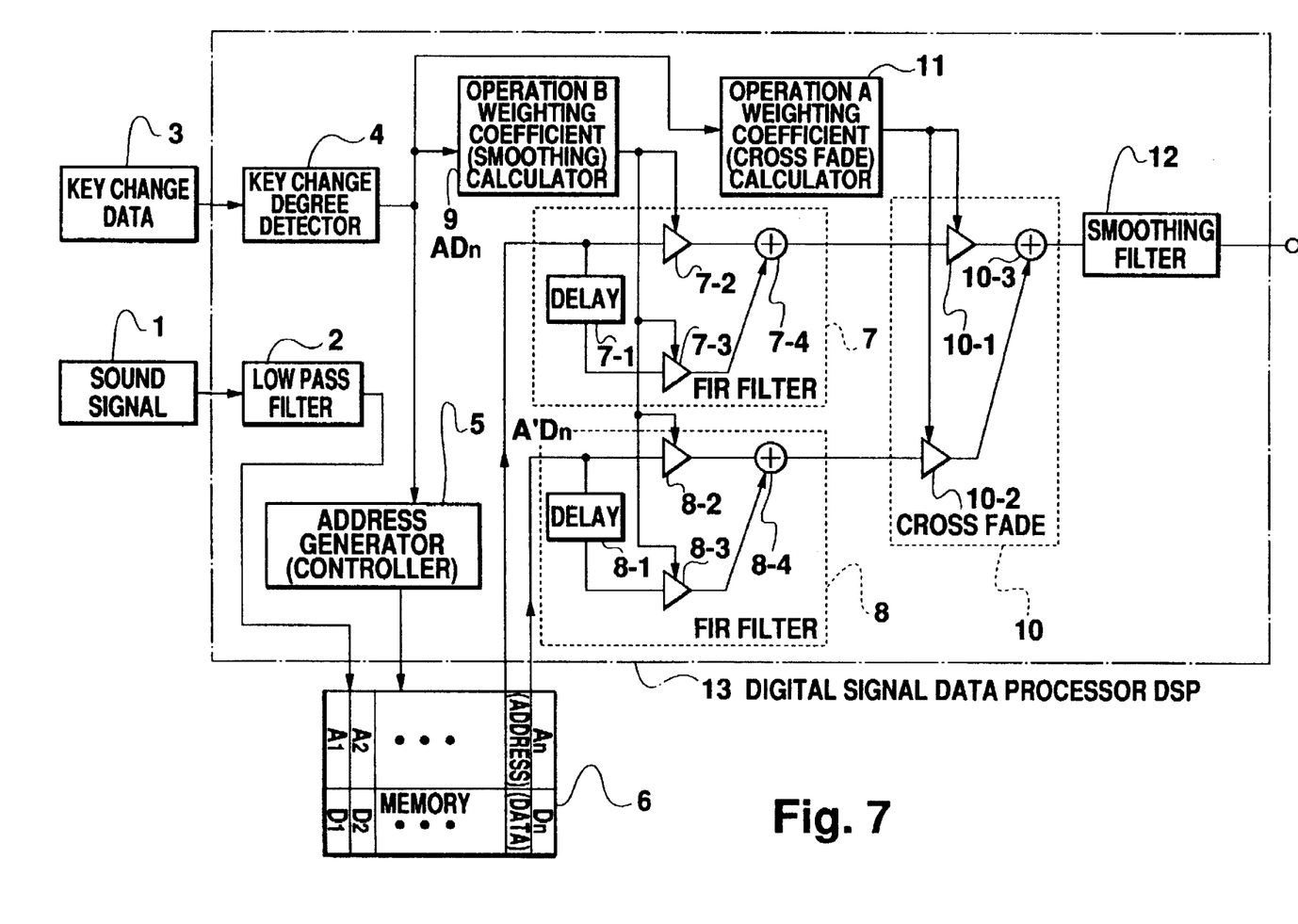
FIG. 7 is a diagram showing a system configuration for processing the small and large discontinuities according to the present invention.

In the third embodiment, an apparatus for processing discontinuities is provided. FIG. 7 shows a structure of the apparatus of the invention. This apparatus comprises a sound signal input section 1; a band limit filter 2; a pitch shift command data input section 3; a pitch shift degree detector 4; an address generator (controller) 5; a memory 6 (which is externally provided in this embodiment); FIR filters 7 and 8 which respectively include delay circuits 7-1, 8-1, first multipliers 7-2, 8-2, second multipliers 7-3, 8-3, adders 7-4, 8-4; an operation B (smoothing) weighting coefficient calculator 9; a cross fade processing section 10; an operation A (cross fade) weighting coefficient calculator 11; and a smoothing filter 12. The numeral 13 represents a digital signal processor (DSP) which includes the elements 4–12. These elements may be realized as an LSI, and in the actual DSP, only an adder and a multiplier may be used for all addition and multiplication. However, of course, these elements may be realized as separate circuits.

Figure 6:
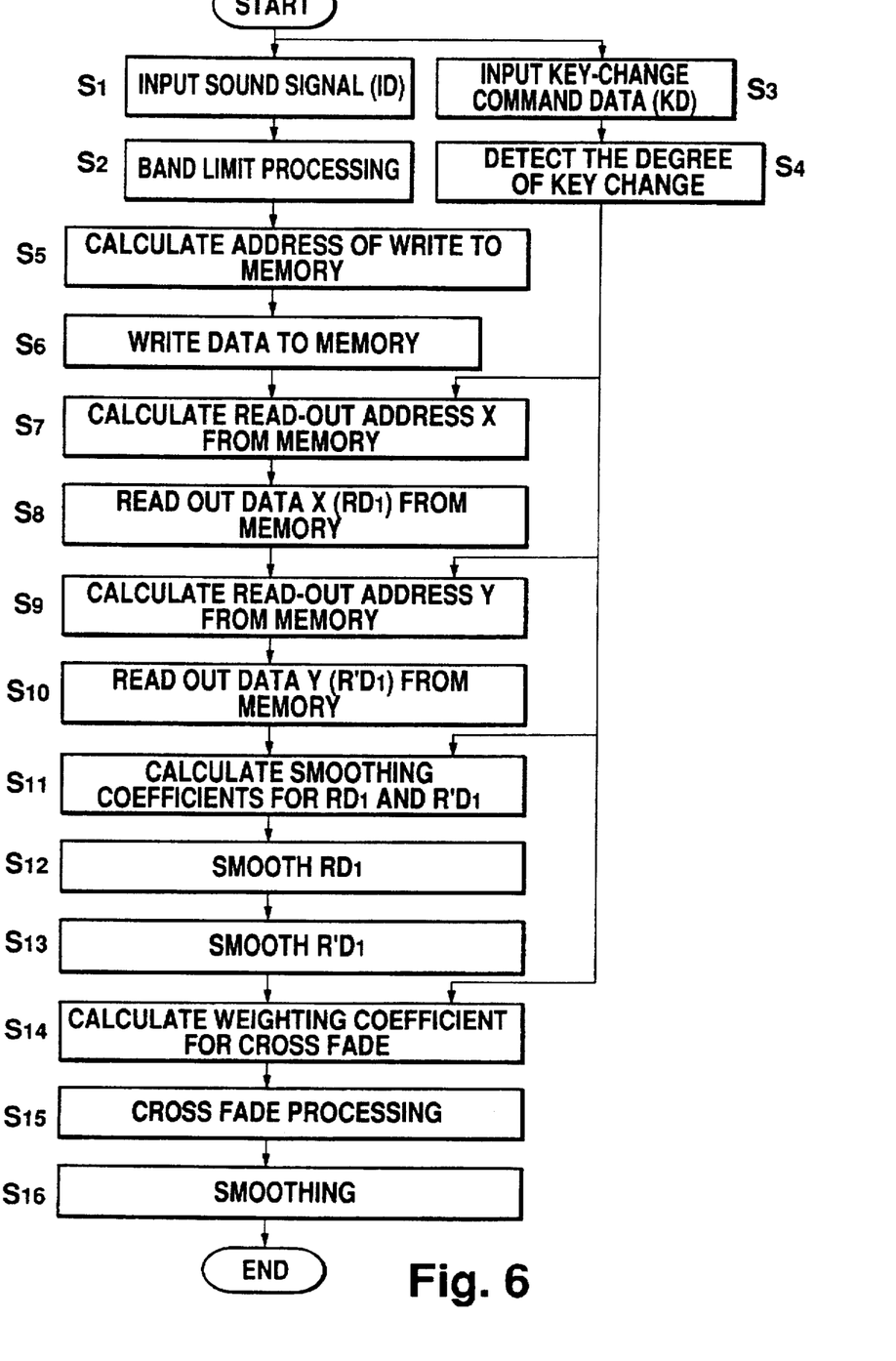
FIG. 6 is a flow chart showing processing of the small and large discontinuities according to the present invention.

Next, the operation of this apparatus will be described in reference to FIG. 6. A digital sound signal is input to the apparatus (S1). The input digital signal is subject to band limit processing (S2), and then written one data item after another in the sequence of addresses in the memory 6 (S5 and S6). Meanwhile, a pitch shift command data is also input to the apparatus (S3), and the extent of the pitch shift is detected by the pitch shift degree detector 4, based on the pitch shift command data (S4). Address generator (controller) calculates read-out addresses X and Y in response to the extent of the pitch shift (S7 and S9), and data RD1 and R'D1 are read out from the addresses X and Y in the memory 6, respectively (S8 and S10). The operations S7 and S8 correspond to the data sequence ADn, while the operations S9 and S10 correspond to the other data sequence A'Dn.

The operation B weighting coefficient calculator 9 calculates weighting coefficients for smoothing the data sequences AD1 and A'D1 read out from the memory 6 (S11). The data sequences AD1 and A'D1 are smoothed in the FIR filters 7 and 8, respectively, by using the calculated respective weighting coefficients to process the small discontinuities (S12, S13).

The operation A weighing coefficient calculator 11 calculates weighting coefficients for cross fading (S14), and the smoothed data sequences AD1 and A'D1 are cross faded by using the calculated weighting coefficients to process the large discontinuities (S15).

The data which have been subjected to the cross fading process are further smoothed by the smoothing filter 12 for greater improvement of the total sound quality (S16).

Then the operation returns to the S7 and S9, and the next data sequences AD2 and A'D2 are read out from the memory 6, and the same operations as described above are repeated. These processes are carried out for the subsequent data sequences.

To describe the above operation in detail, an A/D converted sound signal is input via the sound signal input section 1. The input signal passes the band limit filter 2, and is written into the memory 6 in accordance with the address calculated by the address generator 5. A desired pitch shift degree is selected by the user and the pitch shift degree command data is input via the pitch shift command data input section 3. In response to this command data, the extent of the pitch shift is detected by the pitch shift degree detector 4.

Since two data sequences having different timings of discontinuity occurrence are necessary for the cross fade process, the two data sequences ADn and A'Dn are read out from the memory 6 with their phases shifted, which are then applied to the FIR filter 7 and 8, respectively.

The operation B (smoothing) weighting coefficient calculator 9 calculates coefficients "a" and "b" based on the pitch shift coefficient K supplied from the pitch shift degree detector 4. The coefficient "a" is applied to the first multipliers 7-2 and 8-2, while the coefficient "b" is applied to the second multipliers 7-3 and 8-3 of the FIR filters 7 and 8. After the data sequences ADn and A'Dn are smoothed by the FIR filters 7 and 8, respectively, using the weighting coefficients "a" and "b", the resultant data are applied to the cross fade processing section 10.

The operation A (cross fade) weighting coefficient calculator 11 calculates coefficients Ci and Cd based on the pitch shift coefficient K supplied from the pitch shift degree detector 4, which are applied to the multipliers 10-1 and 10-2 of the cross fade processing section 10 to process the large discontinuities.

Although the thus processed sound data, which has been subject to processing for both small and large discontinuities, may be output at this stage, it is further passed through the smoothing filter 12 in this embodiment to provide smoother and higher quality sound signals.

As has been described, according to this invention, small discontinuities in digital sound signals caused by pitch shift are effectively processed by simple data processing with pitch shift coefficients, without using low pass filters, and the output sound quality is greatly improved.

Large discontinuities are also effectively processed by processing the overlapped two data sequences with nonlinear weighting coefficients so that the two data values at every discontinuity point vary along an upwardly convex polygonal line. Consequently, The extent of the large discontinuity that occurs for every segment is greatly reduced. Furthermore, offset of the two data values, which is conventionally caused by linear overlapping of the two data values, is avoided by using non-linear weighting coefficients. Thus, even when the pitch is changed considerably, sound quality degradation is effectively avoided.

What is claimed is:

1. A method for processing small discontinuities caused by a digital pitch shift operation, said method comprising the steps of:

multiplying a current input signal by a coefficient "a";

delaying the input signal;

multiplying the delayed signal by a coefficient "b"; and adding the products of the first and second multiplications to smooth the small discontinuities caused by the pitch shift operation, wherein said coefficients "a" and "b" are changed while maintaining a predetermined relationship, and, for the pitch down operation, the pitch down processed data value is moderately approximated to the delayed data value within the period where the small discontinuity occurs, and for the pitch up operation, the pitch up processed data values are moderately approximated to the current data value within the period where the small discontinuity occurs, to reduce the extent of the data discontinuity, and the coefficients "a" and "b" satisfy the equation a+b=1, the value "a" decreases from 1 by a pitch shift degree coefficient K for the pitch down operation, and when reaching 0 or less, the value "a" is reset to a predetermined value, while for the pitch up operation, the value "a" increases from 0 by a pitch shift degree coefficient K, and when reaching 1 or more, the value "a" is reset to a predetermined value.

2. A method for processing small discontinuities caused by a digital pitch shift operation, said method comprising the steps of:

multiplying a current input signal by a coefficient "a";

delaying the input signal;

multiplying the delayed signal by a coefficient "b"; and adding the products of the first and second multiplications to smooth the small discontinuities caused by the pitch shift operation, wherein said coefficients "a" and "b" are changed while maintaining a predetermined relationship, and, for the pitch down operation, the pitch down processed data value is moderately approximated to the delayed data value within the period where the small discontinuity occurs, and for the pitch up operation, the pitch up processed data values are moderately approximated to the current data value within the period where the small discontinuity occurs, to reduce the extent of the data discontinuity, and the coefficients "a" and "b" satisfy the equation a+b=1, the value "a" decreases from 1 by a pitch shift degree coefficient K for the pitch down operation, and when reaching 0 or less, the same data as one sampling period before is read out again from the memory which stores digital sound sampling data, while for the pitch up operation, the value "a" increases from 0 by a pitch shift degree coefficient K, and when reaching 1 or more, the data to be read out from the memory at that sampling period is skipped.

3. A method according to claim 1, in which the coefficients "a" and "b" satisfy the equation a+b=1, the value "a" decreases from 1 by a pitch shift degree coefficient K for the pitch down operation, and when reaching 0 or less, the same data as one sampling period before is read out again from the memory which stores the digital sound sampling data, while for the pitch up operation, the value "a" increases from 0 by a pitch shift degree coefficient K, and when reaching 1 or more, the data to be read out from the memory at that sampling period is skipped.

4. A method according to either of claim 1, 2, or 3, in which said coefficients "a" and "b" are determined by a discontinuity detecting counter (NCC), the NCC value being varied for every sampling period by a pitch shift coefficient K, and for the pitch down operation, the NCC value is decreased from a value 1 by a pitch shift coefficient K, and when NCC>0, the value "a" is equal to the NCC value (a=NCC), when the NCC value reaches 0 or less, a value 1 is added to the NCC and "a" is set to 0.5 (NCC=NCC+1, a=0.5), while for the pitch up operation, the NCC value is increased from a value 0 by a pitch shift coefficient K, and when NCC<1, the value "a" is equal to the NCC value (a=NCC), when the NCC value reaches 1 or more, a value 1 is subtracted from the NCC and "a" is set to 0.5 (NCC=NCC−1, a=0.5).

5. A method for processing large discontinuities in digital sound signals, comprising the steps of:

producing two converted data sequences from one original input data sequence, the timings of the large discontinuity occurrence for the data sequences being offset with respect to each other; and cross fading said two converted data sequences by overlapping them, one data value of the converted signal in which a discontinuity occurs being increased from its discontinuity occurrence point by a weighting coefficient, while the other is decreased by a weighting coefficient from the same point in time, said weighting values for the two data sequences varying in time along an upwardly convex polygonal line.

6. A method according to claim 5, in which said weighting values for the two data sequences vary in time along a polygonal line approximate to a ¼ cycle of a sine curve.

7. A method according to claim 5, in which said weighting coefficients for the two data sequences vary in time according to the following rules;

the initial value of an increasing amount $\Delta Ci$ of the weighting coefficient Ci for a discontinued data sequence is set greater than that of a decreasing amount $\Delta Cd$ of the weighting coefficient Cd for the other data sequence, and when the level of Ci becomes greater than the level of Cd, the value of $\Delta Ci$ and $\Delta Cd$ are switched, whereby the relationship among Ci, Cd, $\Delta Ci$ and $\Delta Cd$ is represented as Ci=Ci+$\Delta Ci$, Cd=Cd−$\Delta Cd$ for the former portion of the polygonal line, and as Ci=Ci+$\Delta Cd$, Cd=Cd−$\Delta Ci$ for the latter portion of the polygonal line.

8. An apparatus for processing discontinuities in a digital sound signal caused by a pitch shift operation, comprising:

means for storing the input sound data;

means for inputting a pitch shift extent and for generating an address, when the pitch shift extent represents pitch down, the same address being generated twice every predetermined cycle of periods defined by the pitch shift extent, and when the pitch shift extent represents pitch up, a certain address being skipped every predetermined cycle of periods defined by the pitch shift extent;

means for reading out two sound data sequences from the input sound data stored in the storage means, based on the addresses generated by the address generating means;

first smoothing means for inputting and smoothing one of the two sound data sequences;

second smoothing means for inputting and smoothing the other sound data sequence;

means for calculating weighting coefficients, based on the pitch shift extent, for each of the smoothing process and applying them to the first and second smoothing means;

means for cross fading the two smoothed data sequences; and means for calculating weighting coefficients, based on the pitch shift extent, for cross fading and applying them to the cross fade processing means.

9. An apparatus for processing large discontinuities in digital sound signals, comprising:

means for producing two converted data sequences from one original input data sequence, the timings of the large discontinuity occurrence for the data sequences being offset with respect to each other;

means for cross fading said two converted data sequences by overlapping them, one data value of the converted signal in which the small discontinuity occurs being increased from its discontinuity occurrence point by a weighting coefficient while the other is decreased by a weighting coefficient from the same point in time; and means for controlling the cross fade weighting values so that the weighting coefficients for the two data sequences vary in time along an upwardly convex polygonal line.

10. An apparatus according to claim 9, in which said weighting coefficients for the two data sequences vary in time along a polygonal line approximate to a ¼ cycle of a sine curve.

* * * * *